(12) United States Patent
Miyoshi et al.

(10) Patent No.: US 8,999,102 B2
(45) Date of Patent: Apr. 7, 2015

(54) SUBSTRATE PROCESSING APPARATUS

(71) Applicant: Tokyo Electron Limited, Tokyo (JP)

(72) Inventors: Hidenori Miyoshi, Nirasaki (JP); Shuji Azumo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/306,718

(22) Filed: Jun. 17, 2014

(65) Prior Publication Data
US 2014/0290857 A1 Oct. 2, 2014

Related U.S. Application Data

(62) Division of application No. 13/227,689, filed on Sep. 8, 2011, now Pat. No. 8,785,311.

(30) Foreign Application Priority Data

Sep. 13, 2010 (JP) .................................. 2010-203923

(51) Int. Cl.
| | |
|---|---|
| H01L 21/02 | (2006.01) |
| H01L 21/67 | (2006.01) |
| H01L 21/28 | (2006.01) |
| H01L 21/3205 | (2006.01) |
| H01L 21/445 | (2006.01) |
| H01L 21/768 | (2006.01) |
| H01L 29/49 | (2006.01) |
| H01L 29/51 | (2006.01) |
| H01L 51/05 | (2006.01) |

(Continued)

(52) U.S. Cl.
CPC .... *H01L 21/02271* (2013.01); *H01L 21/02211* (2013.01); *H01L 21/0223* (2013.01); *H01L 21/28026* (2013.01); *H01L 21/28158* (2013.01); *H01L 21/28264* (2013.01); *H01L 21/32051* (2013.01); *H01L 21/445* (2013.01); *H01L 21/76802* (2013.01); *H01L 21/76874* (2013.01); *H01L 29/49* (2013.01); *H01L 29/4908* (2013.01); *H01L 29/51* (2013.01); *H01L 51/0537* (2013.01); *H01L 21/02348* (2013.01); *H01L 21/67069* (2013.01); *H01L 29/1608* (2013.01); *H01L 29/2003* (2013.01); *H01L 29/22* (2013.01); *H01L 51/0055* (2013.01); *H01L 51/0094* (2013.01)

(58) Field of Classification Search
None
See application file for complete search history.

(56) References Cited

U.S. PATENT DOCUMENTS

| 8,097,175 B2 | 1/2012 | Millward et al. |
|---|---|---|
| 8,404,575 B2 | 3/2013 | Kaneko et al. |

(Continued)

FOREIGN PATENT DOCUMENTS

| JP | 3-225821 A | 10/1991 |
|---|---|---|
| JP | 2002-105656 A | 4/2002 |

(Continued)

*Primary Examiner* — Angel Roman
(74) *Attorney, Agent, or Firm* — Rothwell, Figg, Ernst & Manbeck, P.C.

(57) ABSTRACT

In a method for forming a stacked substrate of a MOS (Metal Oxide Semiconductor) structure including an oxide film serving as a gate insulating film formed on a semiconductor material layer having a film or substrate shape; and a conductive film serving as a gate electrode formed on the oxide film, a polysilane film on the semiconductor material layer is formed by coating a polysilane solution on a surface of a substrate to which the semiconductor material layer is exposed. A film containing metal ions is formed on the polysilane film by coating a metal salt solution thereon, and the polysilane film and the film containing metal ions are respectively modified into a polysiloxane film and a film containing fine metal particles to form the stacked substrate.

6 Claims, 11 Drawing Sheets

(51) Int. Cl.
*H01L 29/16* (2006.01)
*H01L 29/20* (2006.01)
*H01L 29/22* (2006.01)
*H01L 51/00* (2006.01)

(56) References Cited

U.S. PATENT DOCUMENTS

2006/0243989 A1* 11/2006 Yamazaki et al. ............... 257/79
2009/0293808 A1* 12/2009 Yamazaki ..................... 118/722
2009/0311857 A1   12/2009 Todd et al.
2011/0129732 A1*  6/2011 Bachrach et al. ............. 429/220
2012/0211075 A1   8/2012 Seike et al.
2012/0305899 A1   12/2012 Taki et al.

FOREIGN PATENT DOCUMENTS

JP  2004-146449 A  5/2004
JP  2010-182640 A  8/2010

* cited by examiner

SUBSTRATE PROCESSING APPARATUS

CROSS-REFERENCE TO RELATED APPLICATIONS

This application is a division of and is based upon and claims the benefit of priority to U.S. Ser. No. 13/227,689, filed Sep. 8, 2011, and also claims the benefit of priority from Japanese Patent Application No. 2010-203923, filed Sep. 13, 2010. The present application also claims the benefit of priority to each of the foregoing applications and the entire contents of which are incorporated herein by reference.

FIELD OF THE INVENTION

The present invention relates to a film forming method, a method for manufacturing a semiconductor device by using the film forming method, a semiconductor device and a substrate processing apparatus that can be used in the method.

BACKGROUND OF THE INVENTION

Typically, in the manufacturing process of a semiconductor device such as a transistor, an insulating film or a metal film is formed on a substrate, e.g., a semiconductor wafer and, then, the formed film is processed into a desired shape by forming a pattern by employing a photolithographic technique and etching. In the manufacturing process, a film forming process using CVD (Chemical Vapor Deposition), a dry etching process, an asking process and the like are repeated. Almost all of these processes need to be performed under a vacuum environment. For that reason, a vacuum device including a pressure resistant vessel, an exhaust unit and the like is necessary for the manufacturing process of the semiconductor device. Since, however, a vacuum device in use for a film forming process or an etching process is a type of a large scale, there has been a demand for developing a method of manufacturing a semiconductor device simply without using a large-scale vacuum device.

In the meantime, there has been disclosed a method for forming a metal film by using polysilane having a high reducibility (see, e.g., Japanese Patent Application Publication No. 2002-105656). Specifically, a substrate having a surface on which a polysilane film is formed is processed by using a solution containing metal salts formed of a metal whose standard oxidation reduction potential is 0.54 eV or higher to solidify a corresponding metal colloid on the surface of the substrate, and an electroless plating is carried out by using the metal colloid as a plating core so as to form a metal film. In such a metal film forming method, in a base of the metal film, poly silane is oxidized into insulating polysiloxane. However, there has been no clear suggestion about what use is made of a stacked film having such conductive layer and insulating layer.

SUMMARY OF THE INVENTION

In view of the above, the present invention provides a method for forming a stacked film having a MOS structure that is applicable to a semiconductor, e.g., a transistor without using a vacuum device.

In accordance with a first aspect of the present invention, there is provided a method for forming a stacked substrate of a MOS (Metal Oxide Semiconductor) structure including an oxide film serving as a gate insulating film formed on a semiconductor material layer having a film or substrate shape; and a conductive film serving as a gate electrode formed on the oxide film. The method includes forming a polysilane film on the semiconductor material layer by coating a polysilane solution on a surface of a substrate to which the semiconductor material layer is exposed; and forming a film containing metal ions on the polysilane film by coating a metal salt solution thereon and modifying respectively the polysilane film and the film containing metal ions into a polysiloxane film and a film containing fine metal particles to form the stacked substrate.

In accordance with a second aspect of the present invention, there is provided a method for forming a stacked substrate of a MOS structure including a gate insulating film having a first and a second insulating film formed on a semiconductor material layer having a film or substrate shape; and a conductive film serving as a gate electrode formed on the gate insulating film. The method includes forming the first insulating film on the semiconductor material layer; forming a polysilane film on the first insulating film by coating a polysilane solution on a surface of a substrate to which the first insulating film is exposed; and forming a film containing metal ions on the polysilane film by coating a metal salt solution thereon and modifying respectively the polysilane film and the film containing metal ions into a polysiloxane film serving as the second insulating film and a film containing fine metal particles to form the stacked substrate.

In accordance with a third aspect of the present invention, there is provided a method for manufacturing a semiconductor device of a MOS structure including an oxide film serving as a gate insulating film formed on a semiconductor material layer having a film or substrate shape; and a conductive film serving as a gate electrode formed on the oxide film. The method includes forming a first polysilane film on the semiconductor material layer by coating a polysilane solution on a surface of a substrate to which the semiconductor material layer is exposed; forming a monomolecular film in a pattern on the first polysilane film; forming a film containing metal ions on the first polysilane film and the monomolecular film by coating a metal salt solution thereon and modifying respectively the first polysilane film, which is in contact with the film containing metal ions, and the film containing metal ions into a first polysiloxane film and a film containing fine metal particles to form a stacked substrate of a MOS structure; and removing an unmodified portion of the film containing metal ions, the monomolecular film and an unmodified portion of the first polysilane film by an etching.

In accordance with a fourth aspect of the present invention, there is provided a substrate processing apparatus including a first coating unit for forming a polysilane film on a semiconductor material layer having a film or substrate shape by coating a polysilane solution on a surface of a substrate to which the semiconductor material layer is exposed; and a second coating unit for forming a film containing metal ions on the polysilane film by coating a metal salt thereon. The polysilane film and the film containing metal ions are respectively modified into a polysiloxane film and a film containing fine metal particles to form a stacked substrate of a MOS structure.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

First to fourth embodiments of the present invention will now be described in detail with reference to the accompanying drawings which form a part hereof.

First Embodiment

Figure 1:
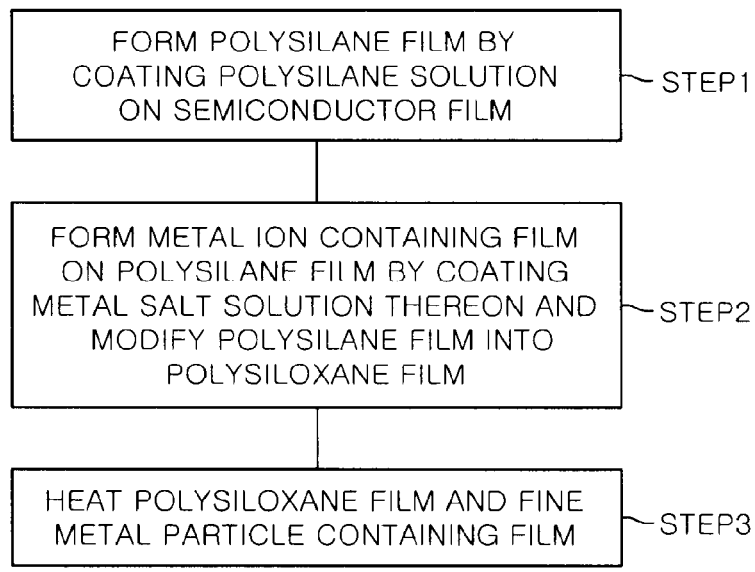
FIG. 1 is a flowchart showing an outline of steps of a film forming method in accordance with a first embodiment of the present invention.

A film forming method in accordance with a first embodiment of the present invention will be described hereinafter with reference to FIGS. 1 to 5. FIG. 1 is a flowchart showing major steps of the film forming method in accordance with the first embodiment. FIGS. 2 to 5 show the steps of the film forming method in accordance with the first embodiment. In the present embodiments, a stacked substrate having a MOS (Metal Oxide Semiconductor) structure is manufactured.

Figure 2:
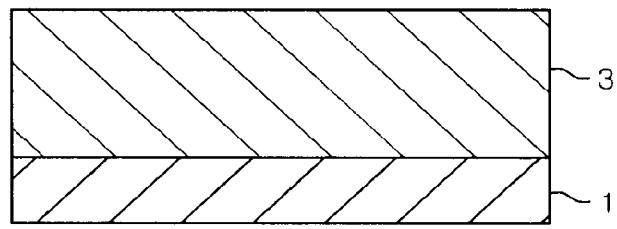
FIG. 2 is a cross sectional view showing a surface of a substrate serving as a target object to be processed in accordance with the film forming method of the first embodiment.

First, FIG. 2 is a cross sectional view showing a surface of a substrate serving as a target object to be processed. For example, a base film 1 serving as an insulating film is formed on the surface of the substrate, and a semiconductor film 3 serving as a semiconductor material layer is stacked on the base film 1. In the present embodiment, a silicon film, a silicon carbide film, a gallium nitride film, a zinc oxide film or an organic semiconductor film may be employed as the semiconductor film 3. The semiconductor film 3 may be formed by using a specific method, e.g., CVD (Chemical Vapor Deposition) or coating. However, it is preferable to form an organic semiconductor film at a low temperature by coating a film of a fusible organic semiconductor material by using a coating method, e.g., a spin coating method.

As an example of the fusible organic semiconductor material, 6,13-bis(triisopropysilylethnyl)pentacene or the like may be employed. Moreover, a semiconductor wafer, a glass substrate, a ceramic substrate, a paper, a synthetic resin film or the like may be employed as the substrate. It is not necessary to include the base film 1. The semiconductor film 3 may be directly formed on the substrate. Alternatively, in the case of employing a semiconductor material, e.g., a semiconductor wafer as the substrate, the base film 1 and the semiconductor film 3 may not be formed thereon. In other words, the semiconductor film 3 serving as a semiconductor material layer may be a semiconductor substrate.

(Step 1: Forming a polysilane film)

Figure 3:
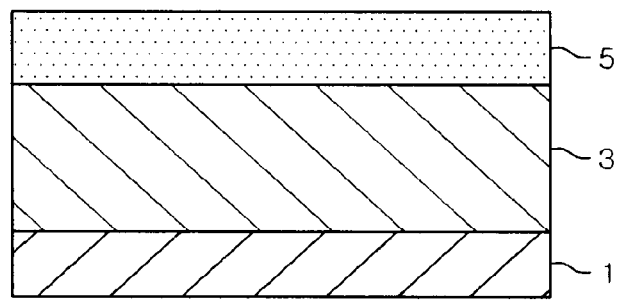
FIG. 3 is a cross sectional view showing the surface of the substrate in which a polysilane film is formed on a semiconductor film.

In step 1, a polysilane solution is coated on the semiconductor film 3 in the substrate shown in FIG. 2, to thereby form a polysilane film 5 on the semiconductor film 3 as shown in FIG. 3. Here, the polysilane solution indicates a solution in which polysilane is dissolved in a solvent. Among various kinds of polysilane, the polysilane that can be dissolved in an organic solvent may be selected. Preferably, a polysilane corresponding to the following chemical formula F1 is used.

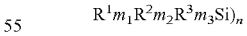

$$R^1{}_{m_1}R^2{}_{m_2}R^3{}_{m_3}Si)_n \qquad \text{F1}$$

In the chemical formula F1, each of "$R^1$" and "$R^2$" indicates hydrogen atoms, which belong to a substituted or unsubstituted monovalent aliphatic hydrocarbon group, alicyclic hydrocarbon group or aromatic hydrocarbon group. An aliphatic hydrocarbon group or an alicyclic hydrocarbon group having carbon numbers of 1 to 12 is preferably used. More preferably, an aliphatic hydrocarbon group or an alicyclic hydrocarbon group having carbon numbers of 1 to 6 is used. For example, a methyl group, an ethyl group, a propyl group, a butyl group, a pentyl group, a hexyl group, a cyclopentyl group, a cyclohexyl group or the like may be employed.

Further, an aromatic hydrocarbon group having carbon numbers of 6 to 14 is preferably used, and an aromatic hydrocarbon group having carbon numbers of 6 to 10 is more preferably used. For example, an aryl group such as a penyl group, a tolyl group, a xylyl group, a naphthyl group and the like; or an aralkyl group such as a benzyl group, a phenethyl group and the like may be used. Besides, the above-described hydrocarbon group whose hydrogen atoms which are partially or entirely substituted with halogen atoms, an alkoxy group, an amino group, an aminoalkyl group or the like may be used. Similarly to $R^1$, "$R^3$" indicates hydrogen atoms, which belong to a substituted or unsubstituted monovalent aliphatic hydrocarbon group, alicyclic hydrocarbon group or aromatic hydrocarbon group, or alkoxy group, halogen atom, oxygen atom or nitrogen atom. As the alkoxy group, an ethoxy group or a methoxy group having carbon numbers of 1 to 4 may be used. As the halogen atom, a chlorine atom, a bromine atom or the like may be used.

Moreover, each of "$m_1$" and "$m_2$" indicates a number ranging from 0.1 to 1. "$m_3$" indicates a number ranging from 0 to 0.5. Preferably, the sum of "$m_1$," "$m_2$" and "$m_3$" ranges between 1 and 2.5 inclusively. "n" indicates a number ranging from 10 to 100,000.

As for the solvent in use for the polysilane solution, aromatic hydrocarbon, e.g., benzene, toluene or xylene or an ether type solvent, e.g., tetrahydrofuran or dibutyl ethyl may be preferably used.

The polysilane film 5 is formed to have a dried film thickness in the range between, e.g., 2 and 1000 nm preferably, or 10 and 100 nm more preferably. In the case of using a polysiloxane film formed by modification as a gate insulating film of a transistor, if the film thickness is smaller than 2 nm, it is difficult to obtain sufficient insulation property, which causes a leakage current to be increased. On the other hand, if the film thickness is greater than 1000 nm, the polysilane may not be completely oxidized; and thus remaining portions of the polysilane which have not been oxidized may result in the degradation in the electrical property of the transistor.

The coating of the polysilane solution may be performed in a wet process by using a coating method, e.g., a spin coating method, an inkjet method, a casting method, or a dipping method. Preferably, such coating process is followed by a drying process as necessary.

(Step 2: Forming and Modifying a Film Containing Metal Ions)

Figure 4:
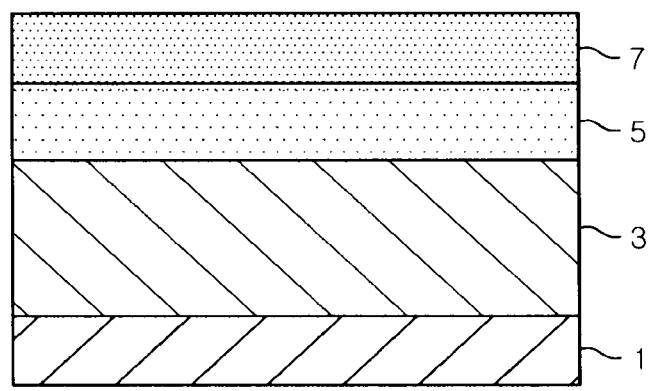
FIG. 4 is a cross sectional view showing the surface of the substrate in which a film containing metal ions is formed on the polysilane film.
Figure 5:
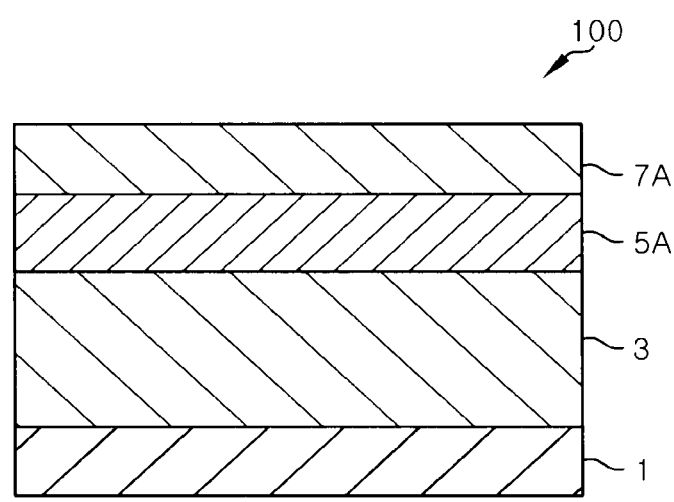
FIG. 5 is a cross sectional view showing a surface of a substrate in which a polysiloxane film and a film containing fine metal particles are formed by modification.

Next, in step 2, a metal salt solution is coated on the polysilane film 5, to thereby form a film 7 containing metal ions (hereinafter referred to as "metal ion containing film 7") thereon as shown in FIG. 4. Then, as shown in FIG. 5, the polysilane of the polysilane film 5 is oxidized into polysiloxane and, thus, the polysilane film 5 is modified into a polysiloxane film 5A. Moreover, the metal ions of the metal ion containing film 7 are reduced to fine metal particles which are resultantly condensed and, thus, the metal ion containing film 7 is modified into a conductive film 7A containing fine metal particles (hereinafter referred to as "fine metal particle containing film 7A"). As such, in accordance with the film forming method of the present embodiment, the metal ions of the metal ion containing film 7A are reduced into the conductive metal by using the strong power of the reduction occurring together with the oxidization from the polysilane into the polysiloxane.

In the present embodiment, the metallic species, e.g., silver, palladium, gold, and platinum, included in the metal salt solution have an oxidation reduction potential that is higher than the standard oxidation reduction potential (0.34 to 0.54 V) of polysilane. For example, $AgBF_4$, $AgClO_4$, $AgPF_6$, $AgBPh_4$, $Ag(CF_3SO_3)$ or $AgNO_3$ may be employed as silver salt. Here, "Ph" indicates a penyl group and this is true hereinafter. As palladium salt, $PdCl_2$, $PdBr_2$, $PdI_2$, $Pd(CN)_2$, $PdSO_4$, $Pd(OCOCH_3)_2$, $Pd(OCOCF_3)_2$, $Pd(BF_4)_2$, $Pd(ClO_4)_2$, $Pd(PF_6)_2$, $Pd(BPh_4)_2$, $Pd(CF_3SO_3)_2$, $Pd(NO_3)_2$ or the like may be employed. As gold salt, $AuCl_3$, $AuBr_3$, $HAuCl_4$, $NaAuCl_4$, $KAuCl_4$, $LiAuCl_4$, $AuCNKAu(CN)_3$ or the like may be employed. As platinum salt, $PtCl_2$, $PtCl_4$, $H_2PtCl_6$, $Na_2PtCl_6$, $K_2PtCl_6$ or the like may be employed.

One of the above metal salts is reduced into fine metal particles and, then, a metal film is formed by condensing the fine metal particles. Accordingly, the silver salt such as $AgBF_4$ or the like may be preferably employed in view of the fact that the silver salt is more easily condensable.

As for a solvent in use for the metal salt solution, an organic solvent, e.g., a ketone group (acetone, methylethylketone or the like), an ester group (ethyl acetate or the like), an alcohol group (methanol, ethanol or the like), an aprotic polar solvent (dimethylformamide, dimethylsulfoxide, hexamethylphosphorictriamide or the like) as well as water may be employed.

The metal ion containing film 7 and the fine metal particle containing film 7A are formed such that the film thickness of the dried films 7 and 7A range from 2 to 1000 nm preferably or from 10 to 100 nm more preferably. If the film thickness is smaller than 2 nm, spontaneous oxidation occurs on the surface of the formed fine metal particle containing film 7A that is exposed to the atmosphere, which may decrease the conductivity of the fine metal particle containing film 7A. On the other hand, if the film thickness is greater than 1000 nm, the reduction of metal ions is insufficiently performed, which may make it difficult to obtain the desired conductivity.

The coating of the metal salt may be performed in a wet process by using a coating method, e.g., a spin coating method, an inkjet method or a casting method. Preferably, such coating process is followed by a drying process as necessary.

In this way, in accordance with the film forming method of the present embodiment, the metal ion containing film 7 and the polysilane film 5 formed by using the coating method of the wet process are respectively modified into the fine metal particle containing film 7A and the polysiloxane film 5A, to thereby form a stacked substrate 100 of a MOS structure as shown in FIG. 5A. Accordingly, it is possible to from the polysiloxane film 5A serving as a gate insulating film and the fine metal particle containing film 7A serving as a gate electrode without performing the film formation using a vacuum device.

(Step 3: Annealing)

Next, in step 3, the two films, i.e., the polysiloxane film 5A and the fine metal particle containing film 7A, formed in step 2, are heated (annealed). The oxidation reaction from polysilane to polysiloxane and the reduction reaction from metal ions to metal can be completed through such annealing. Further, through the annealing, the condensation of the metal particles in the fine metal particle containing film 7A can be accelerated. Accordingly, it is possible to from a high-quality insulating film and a high-quality conductive film by improving, through the annealing, the insulation property of the polysiloxane film 5A and the conductivity of the fine metal particle containing film 7A.

The annealing of step 3 is optional. If the fine metal particle containing film 7A obtained in step 1 and step 2 has a satisfactory conductivity, the annealing of step 3 is omitted. However, through the annealing, the resistivity of the fine metal particle containing film 7A can be decreased. Accordingly, it is preferable to carry out the annealing.

The annealing is preferably carried out in, e.g., a nitrogen atmosphere. The annealing temperature may be set in the range from 30 to 500° C. preferably, or from 40 to 150° C. more preferably. If the annealing temperature is lower than 30° C., it is difficult to complete the oxidation reaction from polysilane to polysiloxane and the reduction reaction from metal ions to metal, thereby resulting in the decrease in the conductivity of the fine metal particle containing film 7A. On the other hand, if the annealing temperature is higher than 500° C., the heating cost may be increased; and there may occur the diffusion of metal atoms.

As such, even when the annealing of step 3 is carried out, the film forming method of the present embodiment can be executed at a relatively low temperature of 500° C. or less without another process for heating the substrate. Accordingly, it is possible to perform the film formation without increasing the heating cost. Moreover, by performing the low-temperature annealing at a temperature of 150° C. or lower, it is possible to use as a substrate a synthetic resin film material having a low heat resistant temperature.

By executing step 1 and step 2 and, if necessary, step 3, it is possible to obtain the stacked substrate 100 of the MOS structure shown in FIG. 5 in which the insulating polysiloxane film 5A is formed on the semiconductor film 3, and the fine metal particle containing film 7A serving as a conductive film is formed on the polysilane film 5A. Then, by processing the stacked substrate 100 in a predetermined pattern, the fine metal particle containing film 7A and the polysiloxane film 5A can be respectively used as a gate electrode of a semiconductor device, e.g., a transistor and a gate insulating film thereof.

The method of forming the fine metal particle containing film 7A and the polysiloxane film 5A will be described in detail in a third embodiment. The fine metal particle containing film 7A and the polysiloxane film 5A may be processed to be formed after a predetermined pattern by using a photolithographic technique and etching, for example. Further, in case that the semiconductor 3 is formed by using a coating method, e.g., a spin coating method, all film forming steps can be executed in a wet process.

Second Embodiment

Figure 6:
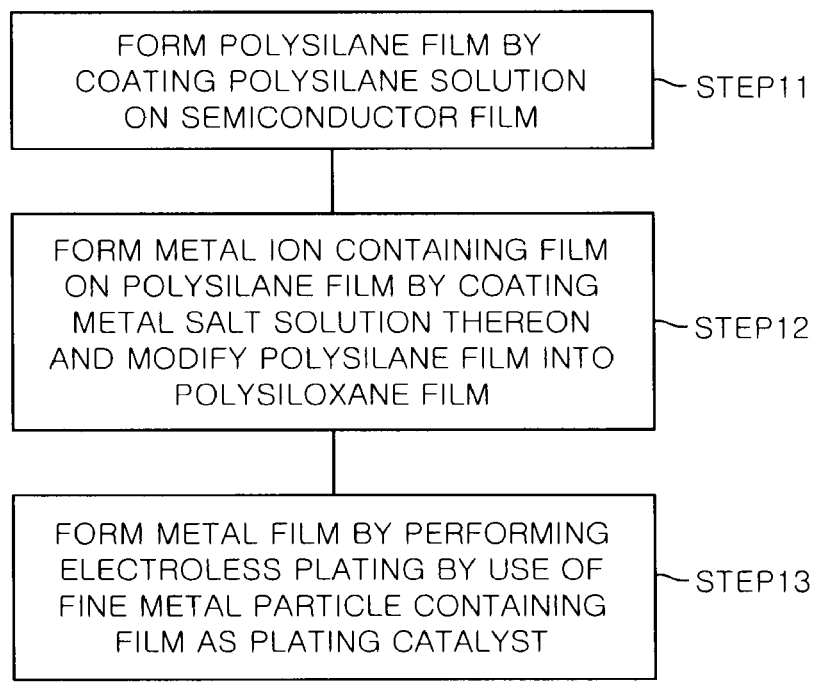
FIG. 6 is a flowchart showing an outline of steps of a film forming method in accordance with a second embodiment of the present invention.
Figure 7:
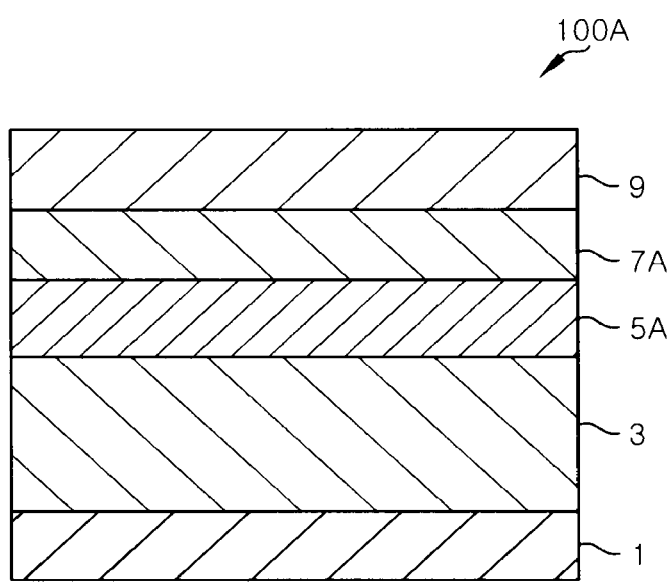
FIG. 7 is a cross sectional view showing a surface of a substrate in which a metal film is formed on a film containing fine metal particles by electroless plating in accordance with the film forming method of the second embodiment.

Next, a film forming method in accordance with a second embodiment of the present invention will be described with reference to FIGS. 6 and 7. FIG. 6 is a flowchart showing major steps of the film forming method of the second embodiment, and FIG. 7 shows the steps of the film forming method of the second embodiment. Similarly, in the present embodiment, a stacked substrate 100A of a MOS structure in use for, e.g., a transistor is manufactured.

(Step 11 and Step 12)

Step 11 and step 12 are respectively identical to step 1 and step 2 of the first embodiment. Accordingly, the present embodiment will be described by using FIGS. 2 to 5, and thus redundant description thereof will be omitted herein.

(Step 13: Electroless Plating)

Next, in step 13, a metal film 9 is formed by performing electroless plating by use of a film containing fine metal particles as a plating catalyst (plating core) as shown in FIG. 7.

A plating bath in use for the electroless plating may contain a metal salt such as nickel sulfate, copper sulfate; a reducer such as sodium hypophosphite, hydrazine, sodium borohydride; a pH adjuster such as sodium acetate; and a complexing agent such as phenylenediamine, potassium sodium tartrate; and the like.

As an example of a specific composition in a copper electroless plating solution, an aqueous solution which contains copper sulfate pentahydrate of 1.25 wt %; potassium sodium tartrate pentahydrate of 5.65 wt %; potassium hydroxide of 1.40 wt %; a formaldehyde 37% solution of 3.50 wt % may be taken. By using the electroless plating solution of the above composition, it is possible to form a copper film at a room temperature.

As an example of a specific composition in a nickel electroless plating solution, an aqueous solution which contains nickel sulfate hexahydrate of 12.50 wt %; sodium hypophosphite of 6.30 wt %; and sodium acetate of 18.70 wt % may be taken. By using the electroless plating solution of the above composition, it is possible to form a nickel film at a temperature that ranges between 50 and 100° C. inclusively.

By the electroless plating of step 13, it is possible to form the low resistant metal film 9 that can be used as a gate electrode on the fine metal particle containing film 7A. Accordingly, in the case of performing the electroless plating of step 13, there is no problem if the fine metal particle containing film 7A has a low conductivity. For example, in the present embodiment, it is sufficient if the fine metal particle containing film 7A serves as a plating core and, thus, the fine metal particle containing film 7A may be in a colloid state having a low conductivity. Further, palladium to which a palladium salt such as $PdCl_2$ or the like is reduced may be preferably used as a plating catalyst metal in view of the compatibility with the electroless plating solution.

By executing step 11 to step 13, it is possible to obtain the stacked substrate 100A of the MOS structure shown in FIG. 7 in which the insulating polysiloxane film 5A is formed on the semiconductor film 3, and the fine metal particle containing film 7A and the metal film 9 serving as conductive films are formed on the polysilane film 5A. Then, by processing the stacked substrate 100A in a predetermined pattern, the fine metal particle containing film 7A and the metal film 9, and the polysilane film 5A can be respectively used as gate electrodes of a semiconductor device, e.g., a transistor and a gate insulating film.

Further, in case that the semiconductor 3 is formed by using a coating method, e.g., a spin coating method, all film forming steps can be executed in a wet process. The method of forming the fine metal particle containing film 7A, the metal film 9 and the polysiloxane film 5A will be described in detail in the third embodiment. The fine metal particle containing film 7A, the metal film 9 and the polysiloxane film 5A may be processed into a predetermined pattern by using a photolithographic technique and etching, for example.

Although it is not shown, the same annealing as that of step 3 of the first embodiment may be performed in the present embodiment. The annealing may be performed between step 12 and step 13 and/or after step 13. By performing the annealing before step 13, it is possible to improve both of the insulation property of the polysiloxane film 5A and the conductivity of the fine metal particle containing film 7A and the metal film 9. By performing the annealing after step 13, it is possible to improve the insulation property of the polysiloxane film 5A and the conductivity of the fine metal particle containing film 7A and the metal film 9 more effectively. In case that the annealing is performed, the conditions are identical to those of step 3 of the first embodiment.

In the present embodiment, other components and effects are identical to those of the first embodiment.

Third Embodiment

Figure 8:
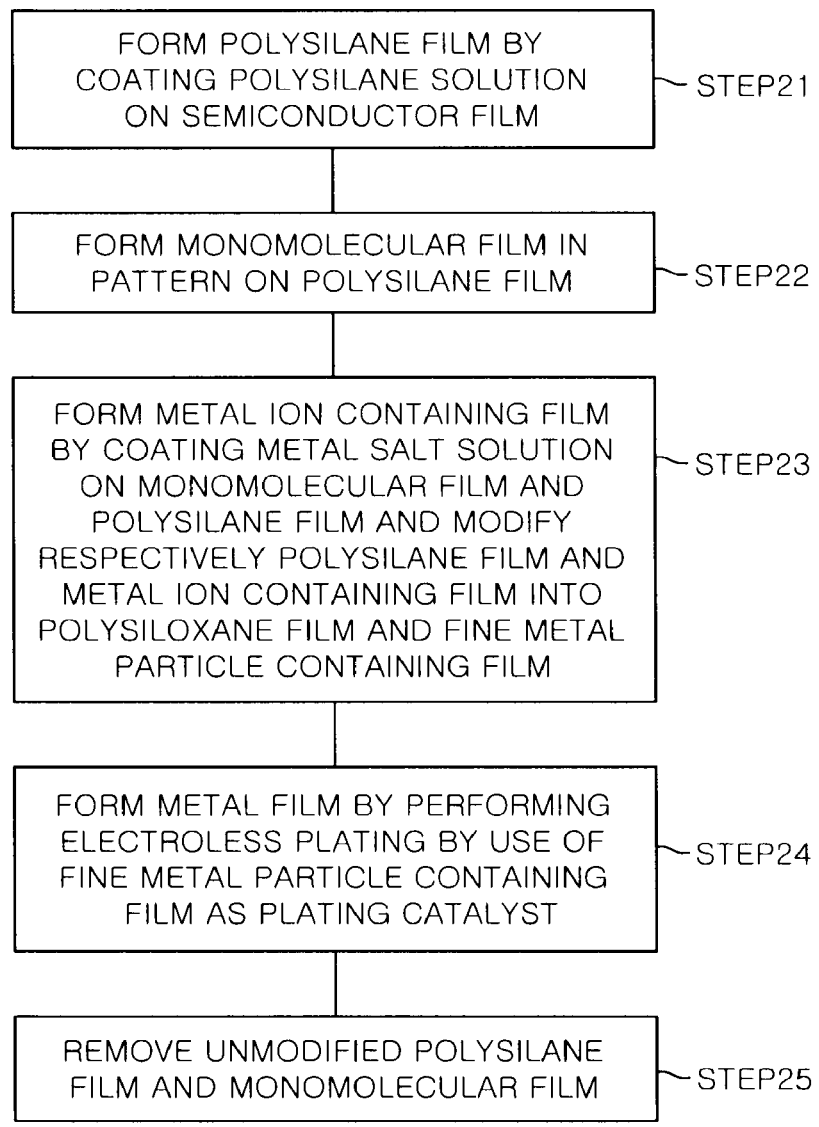
FIG. 8 is a flowchart showing an outline of steps of a film forming method in accordance with a third embodiment of the present invention.

Next, a method of manufacturing a semiconductor device in accordance with the third embodiment of the present invention will be described with reference to FIGS. 8 to 13. FIG. 8 is a flowchart showing major steps of the semiconductor device manufacturing method of the third embodiment. FIGS. 9 to 13 show the steps of the semiconductor device manufacturing method of the third embodiment. Similarly, in the present embodiment, a stacked substrate 101 of a MOS structure in use for, e.g., a transistor is manufactured.

(Step 21: Forming Polysilane Film)

Step 21 of the present embodiment is identical to step 1 of the first embodiment. Accordingly, the present embodiment will be described by using FIGS. 2 and 3 of the first embodiment, and thus redundant description thereof will be omitted herein.

(Step 22)

Figure 9:
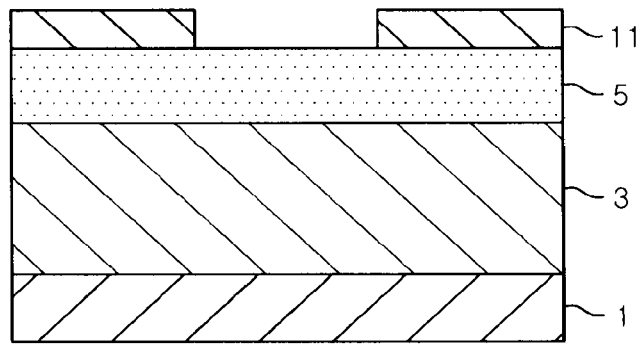
FIG. 9 is a cross sectional view showing a surface of a substrate in which a monomolecular film is formed in a pattern on a polysilane film in accordance with the film forming method of the third embodiment.

Next, in step 22, from the state shown in FIG. 3, a monomolecular film 11 is formed on the polysilane film 5 as shown in FIG. 9. The monomolecular film 11 is a thin film that can be formed by using the ability by which a monomolecular film which is called SAM (Self Assembled Film) is formed by, e.g., a long chain alkyl compound having terminal functionality. In the present embodiment, examples of the long chain alkyl compound having terminal functionality may include an organic sulfur compound such as an alkanethiol group, dialkyd disulfide or the like; an organic silane compound; alcohol; and an amine compound; and the like. In such long chain alkyl compounds having terminal functionality, the organic silane compound that is referred to as R—Si(OR')$_3$ may be taken as an example of the compound that can be used in order to preferably form a monomolecular film on the polysilane film 5. Here, R and R' indicate a hydrocarbon group such as an alkyl group.

The monomolecular film 11 is formed in a predetermined pattern by using, e.g., a stamp method or an inkjet method. In accordance with the stamp method, a solution containing the long chain alkyl compound having terminal functionality is coated on a silicon copper stamp formed with a rough pattern, and the monomolecular film 11 is formed by transferring the long chain alkyl compound having terminal functionality from the stamp onto the polysilane film 5 in a predetermined pattern. For example, examples of the solvent in use for the solution containing the long chain alkyl compound having terminal functionality may preferably include an aromatic hydrocarbon group such as benzene, toluene, xylene or the like; an ether type solvent such as tetrahydrofuran, dibutyl ether or the like; an alcohol type solvent such as methanol, ethanol or the like; an alkoxy ethanol type solvent such as ethyl cellosolve, methyl cellosolve or the like; a ketone type solvent such as acetone, methyl ethyl ketone or the like; an ester type solvent such as ethyl acetate, butyl acetate, methyl lactate, ethyl lactate or the like; and an ether ester type solvent such as PGMEA (propylene glycol monomethyl ether acetate) or the like.

The monomolecular film 11 is preferably formed such that its film thickness becomes substantially identical to the thickness of a monolayer to range between, e.g., 0.5 and 5 nm inclusively.

(Step 23: Forming a Film Containing Metal Ions)

Figure 10:
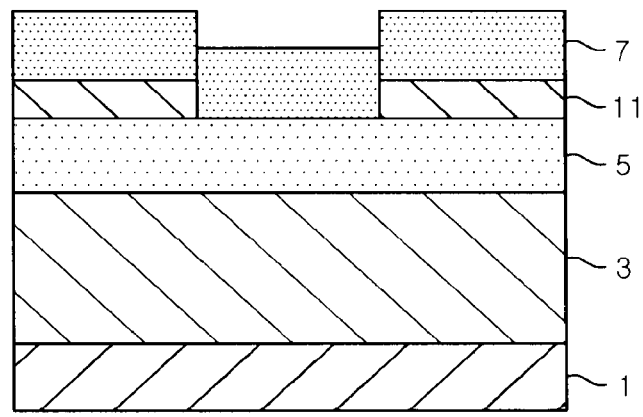
FIG. 10 is a cross sectional view showing the surface of the substrate in which a film containing metal ions is formed on the polysilane film and the monomolecular film.

Next, in step 23, a metal salt is coated on the polysilane film 5 to form the metal ion containing film 7 thereon as shown in FIG. 10. In the present embodiment, the formation of the metal ion containing film 7 may be performed similarly to step 2 of the first embodiment. However, the present embodiment slightly differs from the first embodiment in that the monomolecular film 11 has been formed in a predetermined pattern on the polysilane film 5; and the metal ion containing film 7 is formed on both of the monomolecular film 11 which has been formed in a predetermined pattern on the polysilane film 5 and a remaining portion of the polysilane film 5 where no monomolecular film has been formed.

Figure 11:
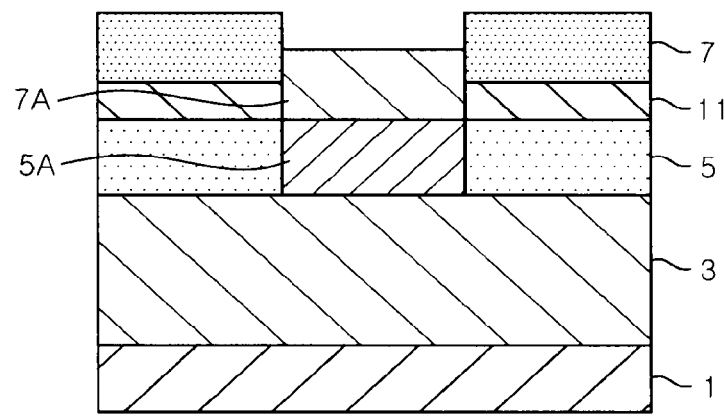
FIG. 11 is a cross sectional view showing the surface of the substrate in which a polysiloxane film having a pattern shape and a film containing fine metal particles are formed by modification.

Then, as shown in FIG. 11, the polysilane film 5 is partially oxidized and modified into the polysiloxane film 5A. Further, the metal ions of the metal ion containing film 7 are partially reduced into fine metal particles and, thus, the metal ion containing film 7 is modified into the fine metal particle containing film 7A. Specifically, only at those portions where the polysilane film 5 and the metal ion containing film 7 are stacked, the polysilane film 5 and the metal ion containing film 7 are respectively modified into the polysiloxane film 5A and the fine metal particle containing film 7A through the oxidation and the reduction. At the portion where the monomolecular film 11 is formed between the metal ion containing film 7 and the polysilane film 5, the metal ion containing film 7 remains as it is without being modified. Accordingly, as shown in FIG. 11, the polysiloxane film 5A and the fine metal particle containing film 7A are formed in the same pattern.

As such, in the semiconductor device manufacturing method of the present embodiment, the polysilane film 5 and the metal ion containing film 7A are respectively modified into the polysiloxane film 5A and the fine metal particle containing film 7A by forming the metal ion containing film 7 on the polysilane film 5 by use of a coating method of a wet process, so that the stacked substrate of the MOS structure is formed. Further, by forming the monomolecular film 11 on the polysilane film 5 in a pattern, the polysiloxane film 5A and the fine metal particle containing film 7A can be formed in a predetermined pattern without performing an etching process. Accordingly, in accordance with the semiconductor device manufacturing method of the present embodiment, it is possible to form the polysiloxane film 5A serving as a gate insulating film and the fine metal particle containing film 7A serving as a gate electrode without performing the film formation using a vacuum device and/or using dry etching.

(Step 24: Electroless Plating)

Figure 12:
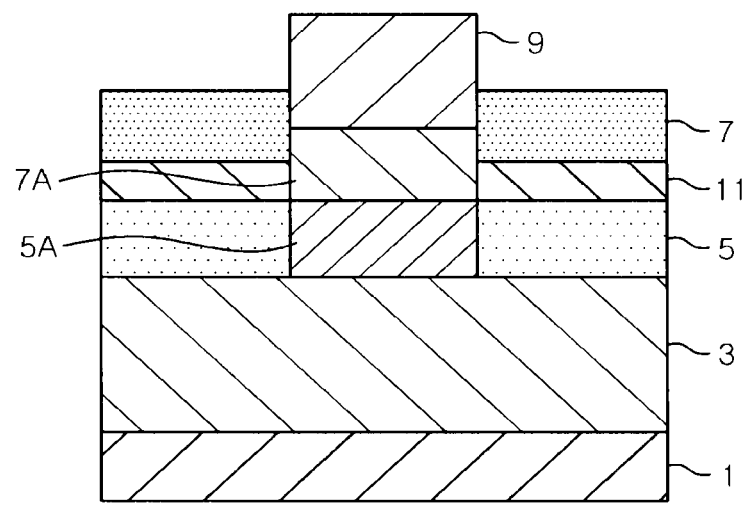
FIG. 12 is a cross sectional view showing the surface of the substrate in which a metal film is formed on the film containing fine metal particles by electroless plating.

Next, in step 24, from the state shown in FIG. 11, the electroless plating is carried out by using the fine metal particle containing film 7A as a plating catalyst (plating core) so as to form the metal film 9 on the fine metal containing film 7A as shown in FIG. 12. In the present embodiment, no plating catalyst (plating core) is provided at a portion where the metal ion containing film 7 remains and, thus, the metal film is not formed on the metal ion containing film 7. Accordingly, the metal film 9 can be stacked in a pattern on the fine metal particle containing film 7A.

In the preset embodiment, the electroless plating of step 24 is optional. If the fine metal particle containing film 7A having a satisfactory conductivity and a satisfactory film thickness is obtained in step 23, the electroless plating may be omitted. However, through the electroless plating, the metal film 9 having a high conductivity can be formed in a desired pattern to have a desired film thickness. Accordingly, it is preferable to carry out the electroless plating.

Specifically, by the electroless plating, it is possible to form the low resistant metal film 9 that can be used as a gate electrode on the fine metal particle containing film 7A. Further, in case that the electroless plating of step 24 is carried out, it is sufficient if the fine metal particle containing film 7A serves as a plating core even though the fine metal particle containing film 7A has a low conductivity and, thus, it is no problem if the fine metal particle containing film 7A is in a colloid state.

The electroless plating of step 24 is identical to that of step 13 of the second embodiment, and thus redundant description thereof will be omitted herein.

(Step 25: Removing Monomolecular Film and Polysilane Film)

Next, a remaining portion of the metal ion containing film 7 that has not been modified into the fine metal particle containing film 7A, the monomolecular film 11 and a remaining portion of the polysilane film 5 that has not been modified into the polysiloxane film 5A are removed. These films may be removed by using, e.g. a wet etching using a solvent. As the solvent in use for removing the metal ion containing film 7, the same solvent as that in use for the metal salt solution employed to form the metal ion containing film 7 may be preferably used.

As the solvent in use for removing the monomolecular film 11, the same solvent as that in use for the solution containing the long chain alkyl compound having terminal functionality employed to form the monomolecular film 11 may be preferably used. As the solvent in use for removing the polysilane film 5, the same solvent as that in use for the polysilane solution employed to form the polysilane film 5 may be preferably used. If a liquid in which the solvents for removing the above films are mixed is employed, the three kinds of films can be removed by performing the wet etching once. The wet etching may be performed by using a dipping method or a development method by which a solvent is applied to the surface of a substrate by using, e.g., a spin coating method.

By executing step 21 to step 25 described above, the stacked substrate 101 of the MOS structure in which the insulating polysiloxane film 5A, the fine metal particle containing film 7A serving as a conductive film, and the metal film 9 are stacked in a pattern shape is obtained. In other words, in the present embodiment, by using the monomolecular film 11 as a mask, it is possible to form the polysiloxane film 5A, the fine metal particle containing film 7A and the metal film 9 in a predetermined pattern without performing an etching. Further, the metal ion containing film 7A, the monomolecular film 11 and the polysilane film 5 that become unnecessary can be removed by using a wet etching.

Accordingly, it is possible to manufacture the stacked substrate 101 of the MOS structure that can be used for a transistor or the like without performing a process, such as film formation or dry etching, using a vacuum device. Further, by forming the semiconductor film 3 through a coating method, e.g., a spin coating method, it is possible to execute all of the film forming steps in a wet process. Through the following steps conforming to the common procedure, it is possible to manufacture a transistor of the MOS structure, for example.

Although it is not shown, the same annealing as that of step 3 of the first embodiment may be performed in the present embodiment. The annealing may be performed at any timing after step 23. For example, the annealing may be performed between step 23 and step 24, between step 24 and step 25, and/or after step 25. By performing the annealing before step 24, it is possible to improve both of the insulation property of the polysiloxane film 5A and the conductivity of the fine metal particle containing film 7A and the metal film 9. By performing the annealing after step 24, it is possible to improve the insulation property of the polysiloxane film 5A and the conductivity of the fine metal particle containing film 7A and the metal film 9 more effectively.

In case that the annealing is performed, the conditions are identical to those of step 3 of the first embodiment. The annealing may be performed one or more times in the present embodiment. Besides, even when the annealing is performed at a relatively low temperature of 500° C. or lower, it is possible to prevent the significant increase in the heating cost since no step for heating the substrate is included.

In the present embodiment, other components and effects are identical to those of the first and the second embodiment.

Fourth Embodiment

Figure 14:
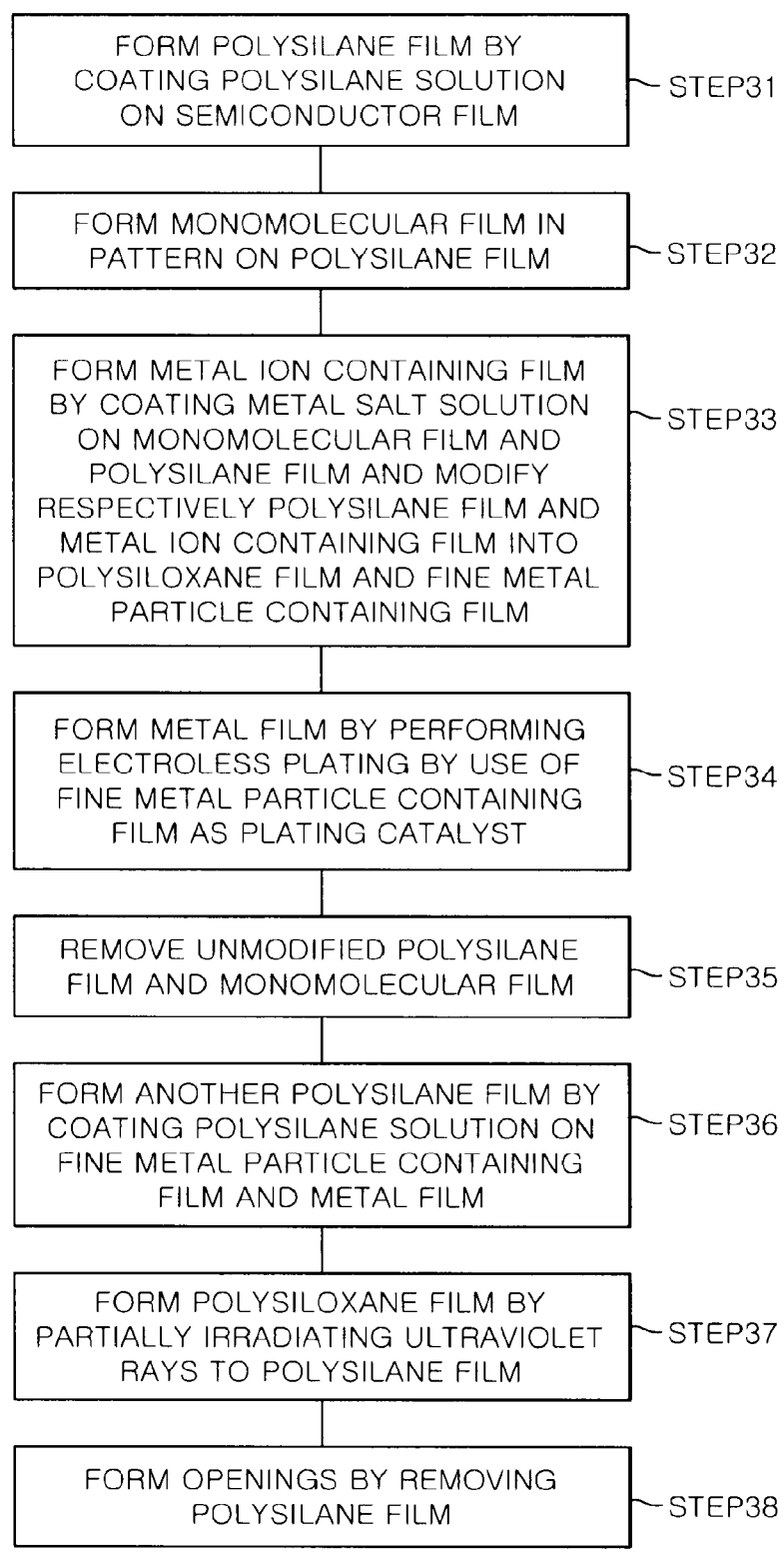
FIG. 14 is a flowchart showing an outline of steps of a film forming method in accordance with a fourth embodiment of the present invention.
Figure 15:
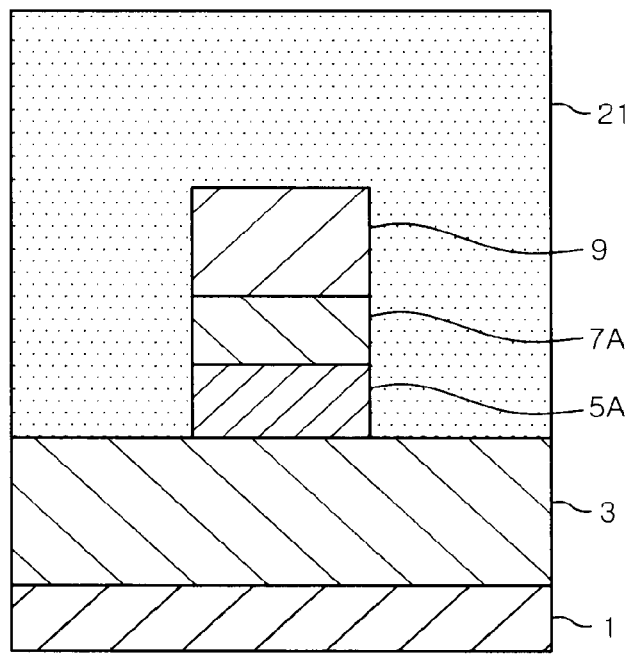
FIG. 15 is a cross sectional view showing a surface of a substrate in which a polysilane film is formed on a metal film and a film containing fine metal particles having a pattern shape in accordance with the film forming method of the fourth embodiment.
Figure 16:
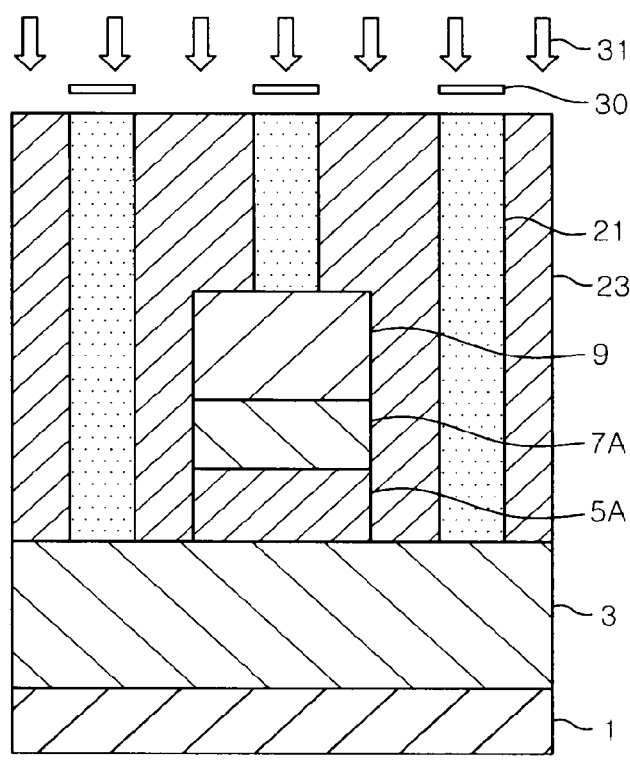
FIG. 16 shows a state in which ultraviolet rays are irradiated to the polysilane film.
Figure 17:
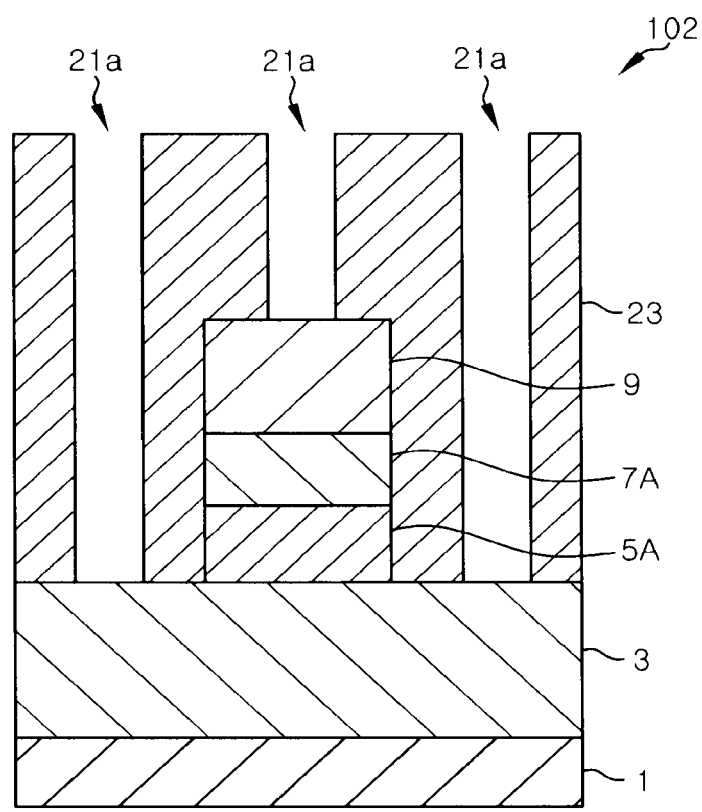
FIG. 17 is a cross sectional view showing the surface of the substrate in which unmodified portions of the polysilane film are removed.

Next, a method of manufacturing a semiconductor device in accordance with a fourth embodiment of the present invention will be described with reference to FIGS. 14 to 17. FIG. 14 is a flowchart showing major steps of the semiconductor device manufacturing method, and FIGS. 15 to 17 show major steps of the semiconductor device manufacturing method. In the present embodiment, a stacked substrate 102 of a MOS structure in use for, e.g., a transistor and an interlayer dielectric film for multilayer interconnection are manufactured.

(Step 31 to step 35)

In the present embodiment, step 31 to step 35 are respectively identical to those of step 21 to step 25, and thus redundant description thereof will be omitted herein. Like in the third embodiment, by executing step 31 to step 35, the stacked substrate 101 of the MOS structure in which the insulating polysiloxane film 5A, the fine metal particle containing film 7A and the metal film 9 are formed in a predetermined pattern is obtained (see FIG. 13).

(Step 36: Forming Polysilane Film)

Figure 13:
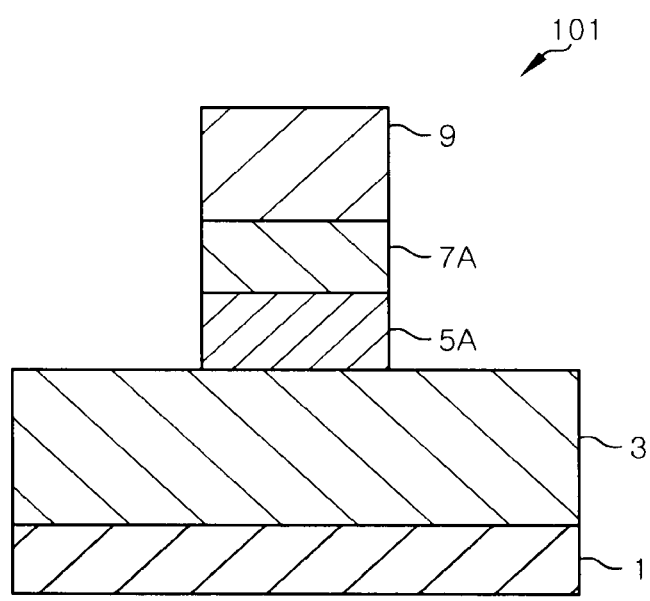
FIG. 13 is a cross sectional view showing the surface of the substrate in which an unmodified portion of the film containing metal ions, an unmodified portion of the polysilane film and the monomolecular film are removed.

In step 36, from the state shown in FIG. 13, a polysilane solution is coated on the semiconductor film 3 in order to form a polysilane film 21 serving to cover the fine metal particle containing film 7A and the metal film 9 as shown in FIG. 15. In the present embodiment, step 36 may be executed similarly to step 1 of the first embodiment except for the point that the polysilane film 21 is formed to have a thicker thickness. Since the polysilane film 21 is to be modified to serve as an interlayer dielectric film at a following step, the polysilane film 21 is formed such that its dried film thickness ranges from, e.g., 50 to 10000 nm preferably, or from 500 to 3000 nm more preferably.

The film thickness that is smaller than 50 nm is not sufficient for the polysilane film 21 to cover the polysiloxane film 5A, the fine metal particle containing film 7A and the metal film 9. Further, if the film thickness is greater than 10000 nm, a crack may be easily developed in the polysilane film 21; and it may be difficult to perform the modification through the irradiation of ultraviolet rays.

(Step 37: Irradiate Ultraviolet Rays)

Next, in step 37, as shown in FIG. 16, a shield member 30 having an opening of a predetermined pattern is used, and ultraviolet rays 31 are partially irradiated to the polysilane film 21. At this time, it is necessary that the irradiated ultraviolet rays have the same wavelength range (from 180 to 400 nm) as that of a light absorber of polysilane. At portions of the polysilane film 21 to which the ultraviolet rays 31 are irradiated, the polysilane film 21 is oxidized into a polysiloxane film 23. However, at other portions to which no ultraviolet rays 31 are irradiated, the polysilane film 21 remains as it is.

The ultraviolet rays are irradiated at the irradiation amount (absorbed light rate) that ranges from 0.1 to 100 $J/cm^3$ preferably, or from 1 to 10 $J/cm^3$ more preferably. As a light source for the ultraviolet rays 31, a mercury lamp, a halogen lamp, a hydrogen discharge tube, a rear gas discharge tube, a tungsten lamp, various lasers or the like may be employed. The ultraviolet ray irradiation is preferably performed in an air atmosphere or an oxygen gas atmosphere.

(Step 38: Removing polysilane film)

Next, in step 38, remaining portions of the polysilane film 21 that have not been modified into the polysiloxane are removed by using, e.g., a wet etching. As a result, as shown in FIG. 17, openings 21a that reach the semiconductor film 3 or the metal film 9 are formed in a predetermined pattern on the insulating polysiloxane film 23. The wet etching can be performed similarly to step 25 of the third embodiment, and thus redundant description thereof will be omitted herein.

The openings 21a formed in step 38 may be used as via holes, for example. Further, via wiring or plug can be formed by burying a conductor, e.g., copper, in the openings 21a by a damascene method or the like.

As such, in the semiconductor device manufacturing method of the present embodiment, wiring openings (e.g., via holes) can be formed by partially modifying the polysilane film 21 into the polysiloxane film 23 through the ultraviolet ray irradiation thereto and by then removing, through the wet etching, the remaining portions of the polysilane film 21 that have not been modified into the polysiloxane. Accordingly, in accordance with the semiconductor device manufacturing method of the present embodiment, it is possible to form the polysiloxane film 23 serving as an interlayer dielectric film having wiring openings without performing etching or film formation using a vacuum device.

By executing steps 31 to 38 described above, the stacked substrate 102 having the MOS structure and the insulating polysiloxane film 23 formed in the periphery of the MOS structure is obtained. In the MOS structure, the insulating polysiloxane film 5A, the fine metal particle containing film 7A serving as a conductor film, and the metal film 9 are stacked on the semiconductor film 3. In the present embodiment, by using the monomolecular film 11 as a mask, it is possible to form the polysiloxane film 5A, the fine metal particle containing film 7A and the metal film 9 in a predetermined pattern without performing an etching. Further, the metal ion containing film 7A, the monomolecular film 11 and the polysilane film 5 that become unnecessary can be removed by using a wet etching. Besides, the openings 21a can be formed on the polysiloxane film 23 by modifying the polysilane film 21 through the ultraviolet ray irradiation thereto and using the wet etching.

Accordingly, it is possible to manufacture the stacked substrate 102 having the MOS structure that can be used for a transistor or the like and the wiring openings, e.g., via holes, without performing a process, such as film formation or dry etching, using a vacuum device. Further, by forming the semiconductor film 3 by a coating method, e.g., a spin coating method, it is possible to execute all of the film forming steps in a wet process. Through the following steps conforming to the common procedure, it is possible to manufacture a semiconductor device of a multilayer interconnection structure having a transistor, for example.

Although it is not shown, the same annealing as that of step 3 of the first embodiment may be performed in the present embodiment. The annealing may be performed at any timing after step 33. For example, the annealing may be performed between step 33 and step 34, between step 34 and step 35, and/or after step 35. By performing the annealing before step 34, it is possible to improve both of the insulation property of the polysiloxane film 5A and the conductivity of the fine metal particle containing film 7A and the metal film 9. By performing the annealing after step 34, it is possible to improve the insulation property of the polysiloxane film 5A and the conductivity of the fine metal particle containing film 7A and the metal film 9 more effectively.

In case that the annealing is performed, the conditions are identical to those of step 3 of the first embodiment. The annealing may be performed one or more times in the present embodiment. Besides, even when the annealing is performed at a relatively low temperature of 500° C. or lower, it is possible to prevent the significant increase in the heating cost since no step for heating the substrate is included.

In step 37, when the ultraviolet rays are irradiated to the polysilane film 21, the surfaces of the metal film 9 and/or the semiconductor film 3 stacked under the polysilane film 21 may be oxidized along with the oxidation of the polysilane film 21. If the oxidation amount of the metal film 9 and/or the semiconductor film 3 is beyond a reference level, this may deteriorate the conductivity and the semiconductor properties. In this case, after the openings 21a are formed in step 38, the annealing may be performed in an atmosphere having a reducing gas, to thereby remove an oxide film formed on the surfaces of the metal film 9 and/or the semiconductor film 3. For example, hydrogen gas may be employed as the reducing gas. Alternatively, an oxide film formed on the surfaces of the metal film 9 and/or the semiconductor film 3 may be removed by using a wet etching or the like instead of the annealing.

In the present embodiment, other components and effects are identical to those of the first to third embodiments.

(Substrate Processing Apparatus)

Figure 18:
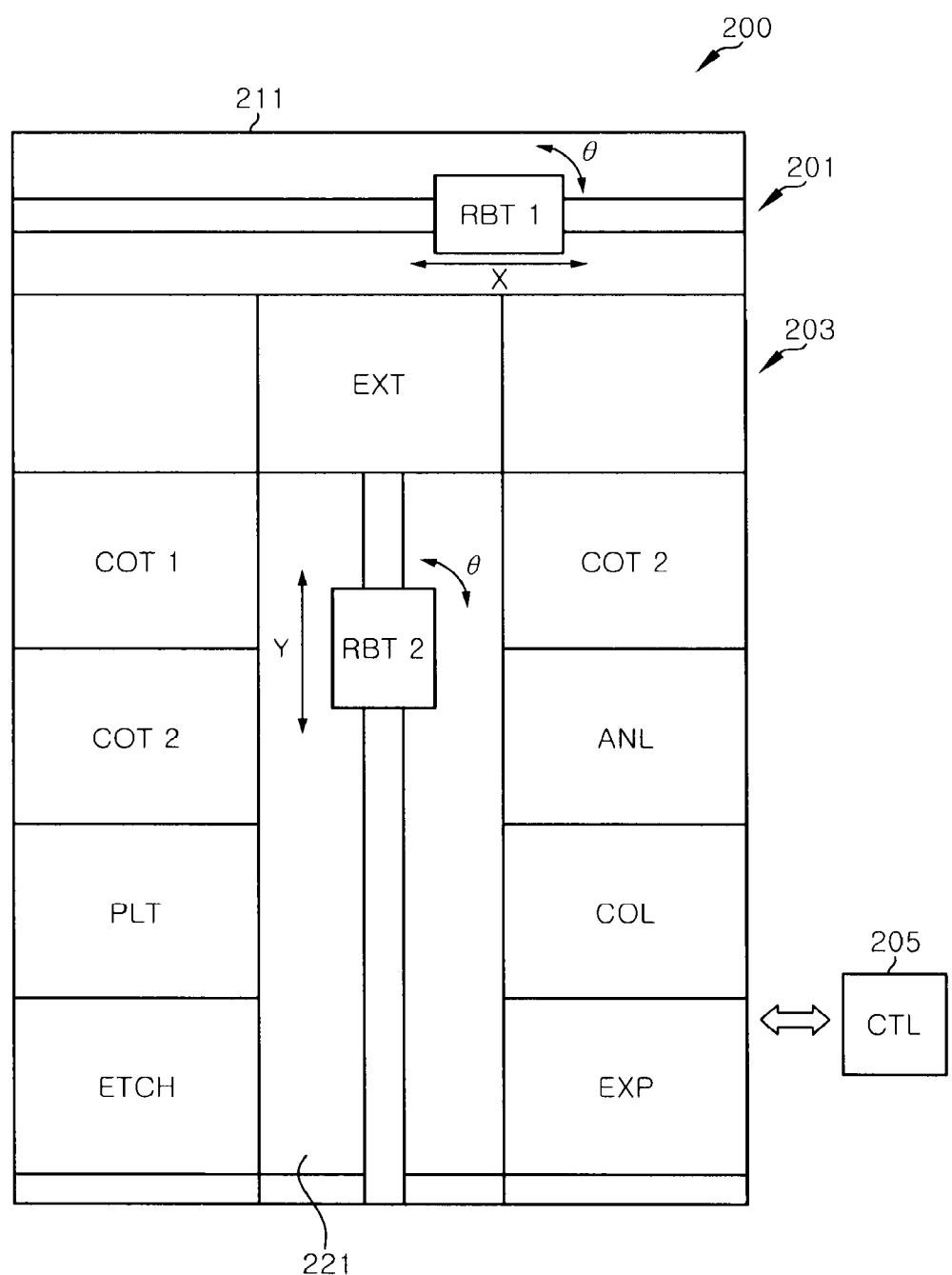
FIG. 18 is a plan view showing a schematic configuration of a substrate processing apparatus.

Next, a substrate processing apparatus 200 in which the film forming method of the first or second embodiment and the semiconductor device manufacturing method of the third or fourth embodiment can be executed will be described with reference to FIG. 18. FIG. 18 is a plan view showing a schematic configuration of the substrate processing apparatus 200. The substrate processing apparatus 200 includes an interface section 201, a process station 203 and a control unit (CTL) 205.

(Interface Section)

The interface section 201 serves to transfer a substrate serving as a target object to be processed between the process station 203 and external processing devices (not shown). By using the interface section 201, it is possible to load or unload a substrate between other systems and the substrate processing apparatus 200. The interface section 201 includes a transfer path 211; and a first transfer unit RBT1 that is movable back and forth in the transfer path 211 in a direction of "X" shown in FIG. 18. The first transfer unit RBT1 includes a transfer arm (not shown) that is rotatable in a direction of "θ." With such configuration, the first transfer unit RBT1 is designed to access an extension unit EXT of the process station 203 which will be described below.

(Process Station)

The process station 203 includes a plurality of processing units for executing a series of steps to perform, on a substrate, a coating of a polysilane solution or a metal salt solution; an annealing; a cooling; an electroless plating; a wet etching of a polysilane film or the like; and an ultraviolet ray irradiation.

The process station 203, as shown in FIG. 18, further includes a transfer path 221 provided at its central portion in a direction of "Y". In the transfer path 221, a second transfer unit RBT2 is provided to be movable in the "Y" direction. The second transfer unit RBT2 includes a substrate supporting member and a transfer arm disposed to be rotatable in the "θ" direction, which are not shown, and serves to transfer a substrate between the processing units.

In the process station 203, all of the processing units are respectively arranged at opposite sides. Specifically, as shown in FIG. 18, the process station 203 includes a first coating unit COT1 for coating a polysilane solution on a substrate; a second coating unit COT2 for coating a metal salt solution; and a third coating unit COT3 for coating a long chain alkyl compound having terminal functionality to form the monomolecular film 11.

The process station 203 further includes an annealing unit ANL for performing an annealing operation on a formed film;

a cooling unit COL for cooling the substrate after the annealing operation; and an etching unit ETCH for etching the polysilane film or the monomolecular film 11, formed on a substrate. Besides, the process station 203 further includes an ultraviolet ray irradiating unit EXP for irradiating ultraviolet rays on the polysilane film 21; and an extension unit EXT for loading or unloading a substrate.

All of the processing units of the process station 203 may use well-known devices. For example, each of the first and the second coating unit COT1 and COT2 may include, e.g., a spin-coating or inkjet coating film forming device (not shown). The third coating unit COT3 may include, e.g., a stamp or inkjet coating film forming device (not shown).

In the meantime, the annealing unit ANL may include a heating device (not shown), e.g., a hot plate heating device or a hot air heating device. The cooling unit COL may include a cooling device which performs the cooling by injecting a temperature controlled air current to a substrate, for example. The plating unit PLT may include a plating device (not shown) provided with a plating bath for performing electroless plating, for example.

In addition, the etching unit ETCH may include a liquid processing device (not shown) for etching the polysilane film 5 or 21 or the monomolecular film 11 by using a processing liquid (solvent). Similarly to a well-known developing device, the liquid processing device may employ, e.g., a method by which the processing liquid is supplied to the substrate while the substrate is rotatably supported and, thus, the processing liquid is scattered onto the substrate by a centrifugal force. The ultraviolet ray irradiating unit EXP may include an ultraviolet ray irradiating device (not shown) provided with an ultraviolet lamp for irradiating ultraviolet rays to, e.g., the polysilane film 32; and the shield member 30. Besides, the extension unit EXT may include a mounting table (not shown) for temporarily mounting a substrate thereon when the substrate is transferred.

(Control Unit)

Various units included in the substrate processing apparatus 200 are connected to and controlled by the control unit 205. The control unit 205 serving as a computer includes a controller having a CPU, a user interface connected to the controller, and a storage unit, which are not shown. The storage unit stores recipes in which processing condition data and the like are written, and/or control programs (software) for realizing various processes which are to be performed in substrate processing apparatus 200 under the control of the controller. As necessary, a desired process is performed in the substrate processing apparatus 200 under the control of the control unit 205 by calling a recipe or a control program from the storage unit and executing the recipe or the control program based on, e.g., an instruction transferred from the user interface.

Moreover, the control programs and the recipes such as the processing condition data and the like, which are stored in a computer-readable storage medium, may be used by installing the computer-readable storage medium in the storage unit. The computer-readable storage medium is not limited to a specific medium. For example, a CD-ROM, a hard disk, a flexible disk, a flash memory, and a DVD may be employed as the computer-readable storage medium. Besides, the recipe may be transmitted from another device through, e.g., a dedicated line so as to be used in the Internet.

The process station 203 of the substrate processing apparatus 200 may further include, e.g., an alignment unit for performing position alignment of the substrate; and a drying unit for drying the substrate after a wet process such as coating or etching, which are not shown.

The sequence of a process to be performed in the substrate processing apparatus 200 having the aforementioned configuration will be described by taking, as an example, the semiconductor device manufacturing method of the fourth embodiment. In the substrate processing apparatus 200, the first transfer unit RBT1 of the interface section 201 transfers to the extension unit EXT of the process station 203 a substrate in which the base film 1 and the semiconductor film 3 are formed.

Then, the substrate is transferred from the extension unit EXT to the first coating unit COT1 by the second transfer unit RBT2. By the first coating unit COT1, a polysilane solution is coated on the semiconductor film 3, to thereby form the polysilane film 5 (step 31). In case that the first coating unit COT1 is of a spin coating type, the polysilane film 5 is formed on the overall surface of the semiconductor film 3 in the substrate to have a uniform film thickness. In the case of an inkjet type, the polysilane film 5 is formed thereon in a predetermined pattern.

Then, the substrate is transferred to the third coating unit COT3 by the second transfer unit RBT2. By the third coating unit COT3, the monomolecular film 11 is formed in a predetermined pattern on the polysilane film 5 in the substrate (step 32). Thereafter, the substrate is transferred to the second coating unit COT2 by the second transfer unit RBT2. A metal salt solution is coated on the polysilane film 5 and the monomolecular film 11 by the second coating unit COT2 so as to form the metal ion containing film 7 thereon and, then, the polysilane film 5 and the metal ion containing film 7 are respectively modified into the polysiloxane film 5A and the fine metal particle containing film 7A (step 33).

Then, the substrate is transferred to the plating unit PLT by the second transfer unit RBT2. By the plating unit PLT, the metal film 9 is formed on the fine metal containing film 7A by selectively performing film formation thereon (step 34).

Thereafter, the substrate is transferred to the etching unit ETCH by the second transfer unit RBT2. By etching unit ETCH, the remaining portion of the polysilane film 5 and the remaining portion of the metal ion containing film 7, which, have not been modified and the monomolecular film 11, are wet-etched and thus removed by using a solvable processing liquid (solvent) (step 35). Then, the substrate is re-transferred to the first coating unit COT1 by the second transfer unit RBT2. By the first coating unit COT1, the polysilane film 21 is thickly formed to cover the film 7A containing fine metal particles and the metal film 9 by coating the polysilane solution on the substrate (step 36).

Thereafter, the substrate is transferred to the ultraviolet ray irradiating unit EXP by the second transfer unit RBT2. By the ultraviolet ray irradiating unit EXP, the ultraviolet rays 31 are partially irradiated to the polysilane film 21 by using the shield member 30 (step 37). By irradiating the ultraviolet rays, the polysilane film 21 is partially modified (oxidized) into the polysiloxane film 23. Then, the substrate is re-transferred to the etching unit ETCH by the second transfer unit RBT2. By the etching unit ETCH, remaining portions of the polysilane film 21 which have not been modified is wet-etched by using a solvable processing liquid (solvent), whereby the unmodified portions of the polysilane film 21 are removed to form the openings 21a in the polysiloxane film (step 38). Thereafter, the substrate is transferred to the extension unit EXT by the second transfer unit RBT2. Then, the substrate is transferred to the first transfer unit RBT1 of the interface section 201 to be loaded therefrom into an external processing device (not shown).

In case that the annealing is carried out, the substrate is transferred to the annealing unit ANL by the second transfer unit RBT2 at a timing after step 33, for example. By heating the polysiloxane film 5A, the film 7A containing fine metal particles and the metal film 9 by the annealing unit ANL, it is possible to complete the oxidation from the polysilane to the polysiloxane to thereby improve the insulation property; and/or the reduction from metal ions to metal to thereby improve the conductivity.

In the substrate processing apparatus 200, the above-mentioned processes are carried out under the control of the control unit 205.

Although the above description has been made by taking as an example the semiconductor device manufacturing method of the fourth embodiment, it shall be obvious that the film forming method of the first or second embodiment and the semiconductor device manufacturing method of the third embodiment can be performed in the substrate processing apparatus 200. By using the substrate processing apparatus 200, it is possible to perform each of the methods of the embodiments at a high throughput rate. Moreover, even though the substrate is transferred to each of the processing units by using the second transfer unit RBT2 that is movable in the horizontal ("Y") direction in FIG. 18, the processing units may be arranged at top and bottom portions in multiple stages; and the substrate may be transferred to each of the processing units by using a transfer unit that is movable in a vertical direction.

Hitherto, the embodiments of the present invention have been described as examples. The present invention, however, is not limited to the embodiments. For example, although the metal film 9 is formed by using the electroless plating in the embodiments, the metal film 9 may be formed by using an electroplating.

Figure 19:
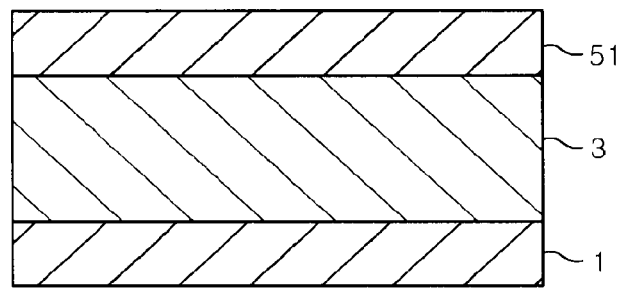
FIG. 19 is a cross sectional view showing a surface of a substrate in which a first insulating film is formed on a semiconductor wafer.
Figure 20:
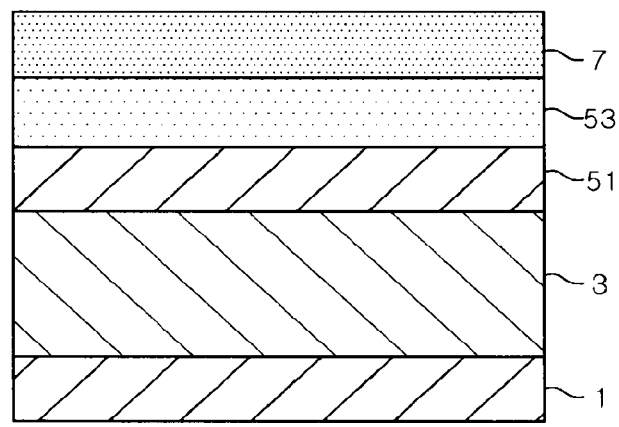
FIG. 20 is a plan view showing the surface of the substrate in which a polysilane film and a film containing metal ions are formed on the first insulating film.
Figure 21:
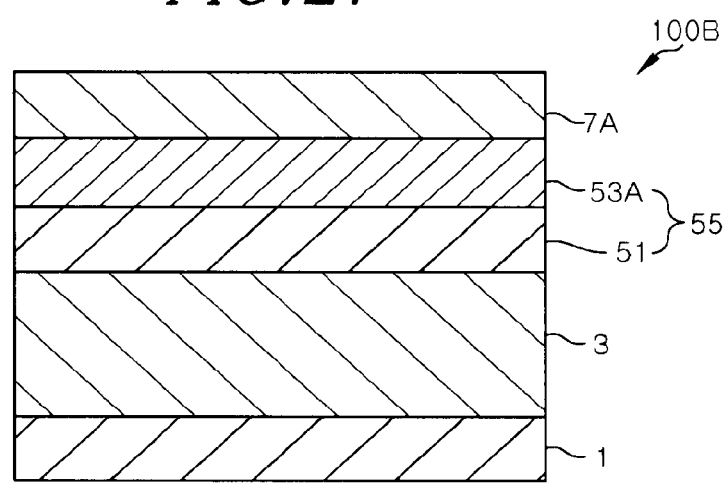
FIG. 21 is a plan view showing the surface of the substrate in which a film containing fine metal particles and the polysiloxane film serving as a second insulating film are formed by modification.

In addition, even though a gate insulating film is formed by using the single polysiloxane film 5A in the above embodiments, the gate insulating film may be formed by using a plurality of insulating films. For example, a first insulating film 51 may be formed on the semiconductor film 3 as shown in FIG. 19 and, then, a polysilane film 53 and the metal ion containing film 7 may be sequentially formed on the first insulating film 53 as shown in FIG. 20. Accordingly, as shown in FIG. 21, the metal ion containing film 7 and the polysilane film 53 can be respectively modified into the fine metal particle containing film 7A and a polysiloxane film, i.e., a second insulating film, 53A.

In this way, it is possible to obtain a stacked substrate 100B of a MOS structure including the fine metal particle containing film 7A, the first and the second insulating film 51 and 53A, and the semiconductor film 3. In this case, a stacked film in which the first and the second insulating film 51 and 53A are stacked serves as a gate insulating film 55. As the first insulating film 51, a polysiloxane film into which a polysilane film is modified by irradiating ultraviolet rays thereto, for example, may be used.

In addition, in the above embodiments, the conductive film is patterned by forming the monomolecular film in a predetermined pattern on the polysilane film and then coating the metal salt solution thereon. However, the metal film may be patterned by using the following method. For example, a monomolecular film may be formed in a predetermined pattern on the fine metal particle containing film 7A from the state shown in FIG. 5 and, then, the electroless plating may be performed on uncovered portions of the fine metal particle containing film 7A which are not covered with the monomolecular film by using the fine metal particle containing film 7A as a plating catalyst, to thereby form a plating metal film at the uncovered portions selectively.

In this case, palladium, alkanethiol and copper may be respectively employed as a preferable metal material of the film containing fine metal particles, a preferable material used for forming the monomolecular film and a preferable metal material of the plating metal film. Here, the alkanethiol has a RSH structure ("R" indicates a substituted or unsubstituted aliphatic group, alicyclic group or aromatic hydrocarbon group). A lipophilic group such as a long chain alkyl group is preferably employed as "R." Specifically, a substituted or unsubstituted monovalent aliphatic hydrocarbon group, alicyclic hydrocarbon group or aromatic hydrocarbon group of carbon numbers of 6 to 25 is preferably employed. More specifically, it is preferable to employ 1-octanethiol of carbon number 8, 1-decanethiol of carbon number 10, hexadecanethiol of carbon number 16, 1-octadecanethiol of carbon number 18, or the like.

For example, examples of a solvent for alkanethiol may preferably include aromatic hydrocarbon, e.g., benzene, toluene or xylene; an ether type solvent, e.g., tetrahydrofuran or dibutyl ether; an alcohol group, e.g., methanol or ethanol; an alkoxy ethanol type solvent, e.g., ethyl cellosolve or methyl cellosolve; a ketone type solvent, e.g., acetone or methyl ethyl ketone; an ester type solvent, e.g., ethyl acetate, butyl acetate, methyl lactate, ethyl lactate; and an ether ester type solvent, e.g., PGMEA (propylene glycol monomethyl ether acetate); or the like.

The annealing is performed by the heating to decrease the resistance of the metal film in the above embodiments. Alternatively, the resistance of the metal film may be decreased by using ray irradiation, for example.

In addition, the substrate processing apparatus 200 may further include a unit for performing the film formation of the base film 1 and the semiconductor film 3 or burying formation of a conductive film on an etching opening, to thereby execute all the steps from the formation of the base film to the burying formation in one single apparatus.

In accordance with the film forming method and the semiconductor device manufacturing method of the present invention, the polysilane film and the film containing metal ions are respectively modified into the polysiloxane film and the film containing fine metal particles so as to form the stacked film of the MOS structure. It is possible to form the polysiloxane film serving as the gate insulating film and the film containing fine metal particles serving as the gate electrode.

While the invention has been shown and described with respect to the embodiments, it will be understood by those skilled in the art that various changes and modifications may be made without departing from the scope of the invention as defined in the following claims.

What is claimed is:

1. A substrate processing apparatus comprising:
   a first coating unit configured to form a polysilane film on a semiconductor material layer having a film or substrate shape by coating a polysilane solution on a surface of a substrate to which the semiconductor material layer is exposed;
   a second coating unit configured to form a film containing metal ions on the polysilane film by coating a metal salt thereon; and
   a transfer unit configured to convey the substrate from the first coating unit to the second coating unit such that after formation of the polysilane film in the first coating unit, the substrate is transferred to the second coating unit,
   wherein the film containing metal ions is formed on the polysilane film, and
   wherein the polysilane film and the film containing metal ions are modified into a polysiloxane film and a film containing fine metal particles, respectively, to form a stacked substrate of a MOS structure.

2. The apparatus of claim 1, further comprising:
a plating unit configured to form a plating by using the film containing fine metal particles as a plating catalyst.

3. The apparatus of claim 1, further comprising:
an annealing unit configured to heat the substrate including the polysiloxane film and the film containing fine metal particles.

4. The apparatus of claim 1, further comprising:
a third coating unit configured to form a monomolecular film in a pattern on the polysilane film; and
an etching unit configured to etch and remove an unmodified portion of the film containing metal ions, the monomolecular film and an unmodified portion of the polysilane film.

5. The apparatus of claim 1, further comprising:
an irradiating unit configured to partially irradiate ultraviolet rays to the polysilane film on the substrate to partially modify the polysilane film into a polysiloxane film.

6. The apparatus of claim 1, further comprising:
a controller configured to control operation of the apparatus such that the substrate is first transferred to the first coating unit for forming the polysilane film, and thereafter transferred to the second coating unit for forming the film containing metal ions.

* * * * *